United States Patent [19]
Hshieh et al.

[11] Patent Number: 5,341,011
[45] Date of Patent: Aug. 23, 1994

[54] SHORT CHANNEL TRENCHED DMOS TRANSISTOR

[75] Inventors: Fwu-Iuan Hshieh; Mike F. Chang, both of Santa Clara; Hamza Yilmaz, Saratoga, all of Calif.

[73] Assignee: Siliconix Incorporated, Santa Clara, Calif.

[21] Appl. No.: 31,798

[22] Filed: Mar. 15, 1993

[51] Int. Cl.⁵ .............................................. H01L 29/10
[52] U.S. Cl. ...................................... 257/330; 257/335; 257/408
[58] Field of Search ............... 257/329, 330, 331, 332, 257/335

[56] References Cited
U.S. PATENT DOCUMENTS 4,954,854 9/1990 Dhong et al. ................... 257/332
5,168,331 12/1992 Yilmaz ............................. 257/331

OTHER PUBLICATIONS

Barbuscia, et al., pp. 757, IEDM, 1984 "Modeling of Polysilicon Dopant Diffusion for Shallow-Junction Bipolar Technology".
S. C. Sun et al., pp. 356–367, IEEE Trans, Electron Devices, vol. Ed-27, Feb. 1980 "Modeling of the On-Resistance of LDMOS, VDMOS, and VMOS Power Transistors".

Primary Examiner—Robert Limanek
Attorney, Agent, or Firm—Skjerven, Morrill, MacPherson, Franklin & Friel

[57] ABSTRACT

A DMOS transistor having a trenched gate is formed in a substrate such that the P body region of the transistor may be formed heavier or deeper while still maintaining a "short" channel. This is accomplished by forming a portion of the N+ type source region within the P body region prior to forming the trench, followed by a second implantation and diffusion of a relatively shallow extension of the N+ source region formed overlying a part of the P body region. The increased depth or doping concentration of the P body region advantageously lowers the resistance of the P body region, while the short channel lowers the on-resistance of the transistor for improved performance.

11 Claims, 5 Drawing Sheets

SHORT CHANNEL TRENCHED DMOS TRANSISTOR

BACKGROUND OF THE INVENTION

1. Field of the Invention

This invention relates to a rugged DMOS trenched transistor with improved resistance characteristics. More specifically, the invention relates the formation of a "short" channel and increased doping levels to reduce the resistance of the body and on-resistance of the transistor for improved performance.

2. Description of the Prior Art

DMOS (double diffused metal oxide semiconductor) transistors are well known in the art as a type of field effect transistor (FET) where the channel length is determined by the higher rate of diffusion of the P body region dopant (typically boron) compared to the N+ source region dopant (typically arsenic or phosphorous). The channel as defined by the body region overlies a lightly doped drift region. DMOS transistors can have very "short" channels and typically do not depend on a lithographic mask to determine channel length. Such DMOS transistors have good punch-through control because of the heavily doped P body shield. The lightly doped drift region minimizes the voltage drop across the channel region by maintaining a uniform field to achieve a velocity saturation. The field near the drain region is the same as in the drift region so that avalanche breakdown, multiplication and oxide charging are lessened, compared to conventional MOSFETs.

In one type of such DMOS transistor a "trench" (groove) is used to form the gate structure. These transistors are typically formed on <100> oriented silicon substrates (wafers), using an anisotropic etch to form the trench having sidewalls sloping from the substrate at 54.7°. The doping distribution is the same as in the above described DMOS transistor. The two channels are located one on each side of the etched groove. The device has a common drain contact at the bottom portion of the substrate. Because many devices can be connected in parallel, these transistors can handle high current and high power so are suitable for power switching applications. It is also well known to form such a trenched DMOS device with vertical trench sidewalls formed by isotropic etching, so the trench is rectangular or "U" shaped in cross section.

Often the trench is completely filled with polysilicon which is doped to make it conductive and hence serves as the gate electrode. This also results in the desired planar structure, i.e. having a nearly flat top surface.

A typical prior art trenched DMOS transistor shown in FIG. 14 includes a substrate 62 doped N+, an epitaxial layer 61 formed thereon doped N−, a body region 63 doped P, and a source region 65 doped N+. The gate electrode 69 is conductive polysilicon formed in a trench 66a lined with an oxide gate insulating layer 66. Trench 66a may be U-shaped, or V shaped as shown in FIG. 14. The source contact 67 shorts the body region 63 to the source region 65, and the drain contact 98 is formed on the substrate 62 backside. The channel length is the length of the P body region 63a adjacent to the gate electrode 69. It is to be understood that the structure of FIG. 14 is illustrative; in other devices which are also well known, the trench 66a is filled by the gate electrode 69, thus establishing a planar principal surface.

Although the trenched DMOS transistor has advantages over purely planar FETs, it has several deficiencies. These deficiencies are the on-resistance of the P-body region and the on-resistance of the channel region.

Device ruggedness as determined by the sheet resistance of the N+/P−/N− JFET (parasitic transistor) formed by respectively regions 65/63a/61 will be reduced in order to maintain the same threshold voltage as a planar (non-trenched) DMOSFET. Also, a short channel is difficult to form adjacent a U-shaped trench because a sacrificial oxidation step normally carried out at high temperature to form the trench is followed up by a subsequent trench etching step, which makes the P− body region deeper than desired.

SUMMARY OF THE INVENTION

In accordance with the invention, a trenched gate DMOS transistor is formed in a substrate such that the body region of the transistor may be formed heavier or deeper while still maintaining a "short" channel. The increased depth or doping concentration of the body region advantageously lowers the resistance of the body region and thus improves device ruggedness, while the short channel lowers the on-resistance of the transistor for improved performance.

It is considered important to the performance of such a device that the channel be narrow or "short". The channel region of such a device is in the P body diffusion, so to achieve electron velocity, this region should be kept as "short" as possible. Reducing the length of this P body diffusion does not affect the operating breakdown voltage of the transistor. It is important that the trench extends in depth at least slightly beyond the depth of the adjacent P body region.

Therefore in accordance with the invention, an ion implantation and diffusion process is used to form a portion of the N+ source region within the P body region prior to forming the trench. This N+ source region is implanted using a mask which is then used to etch the trench. In one embodiment, a "deep body" P+ region is also formed within the P body region and spaced apart from the trench walls. Then the trench is lined with a gate oxide layer and filled with doped polycrystalline silicon as the gate electrode. This is followed by formation of a relatively shallow extension of the N+ source region in a part of the P body region. Finally, conventionally an oxide insulating and a metal interconnect layer are formed over the substrate principal surface.

The purpose of the shallow extension N+ source region is twofold. First, this N+ implantation compensates for the doping concentration of the P body region near the channel. Second, a self-aligned short channel is also formed in the process, and threshold voltage determined by P− peak concentration is feasibly adjusted. This short channel is the result of a combination of the N+ doping compensation and boron (P type) diffusion retardation effect.

In addition, the diffusion retardation effect becomes more pronounced when the dose of the N+ shallow extension source region implantation for the channel formation is heavier. Using this effect, desirably a very short channel with improved resistance characteristics is fabricated.

In a second embodiment, a P tub region is formed in the substrate and an N source region formed in the tub. Then the trench is etched through the N source region, the gate electrode formed in the trench, and the P body region formed on either side of the trench. Then an N+ source extension region of arsenic is formed.

In a third embodiment (otherwise like the second embodiment) the N+ source extension region implantation is phosphorous.

It is to be understood that in other embodiments, the conductivity types of the various semiconductor regions are reversed from those described herein.

DETAILED DESCRIPTION OF THE INVENTION

Figure 1:
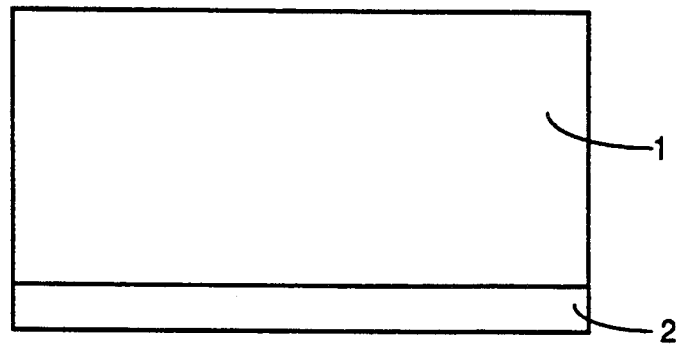
FIGS. 1-8 show process steps for fabrication of a first embodiment with an N+ arsenic source region extension implantation into the source region of the DMOS transistor.

Referring to FIG. 1, an N− epitaxial layer 1 of a first embodiment is shown grown conventionally to a thickness of 5 to 25 $\mu$m (1 $\mu$m=$10^4$ A) on N+ silicon substrate (drain region) 2. Epitaxial layer 1 has a resistivity in the range of 0.2 to 5.0 $\Omega$-cm.

Figure 2:
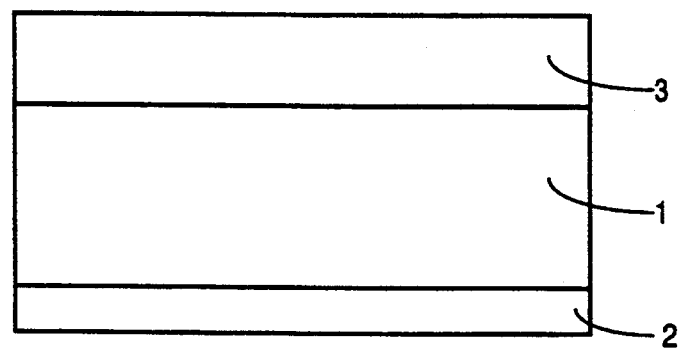

FIG. 2 shows the boron P body 3 implantation (without a mask) and diffusion through a principal surface of the substrate 2. Region 3 is a relatively deep P body region having a final surface doping level of 5E17 to E18/cm$^3$ to a depth of 1.0 to 2.0 $\mu$m and implanted at a dosage level of 5E13 to 2E14/cm$^2$ and energy level of 30 to 60 KeV. (The notation 5E13 conventionally means $5\times10^{13}$).

Figure 3:
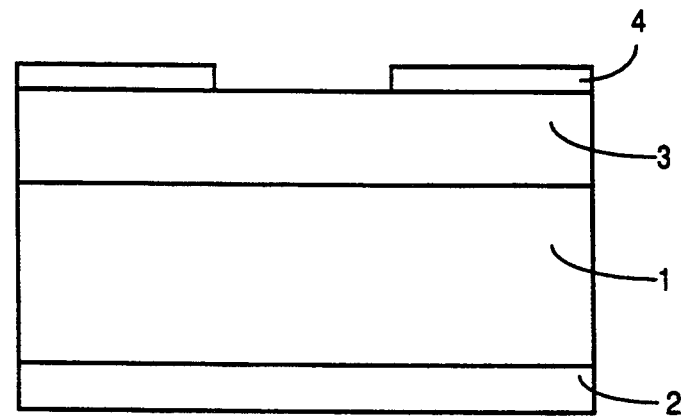

FIG. 3 shows formation of a conventional photolithographic mask layer 4 on the principal surface of the wafer, to be used subsequently for both the N+ source implantation and trench etching. Mask layer 4 is typically oxide 4,000 to 6,000 Å thick.

Figure 4:
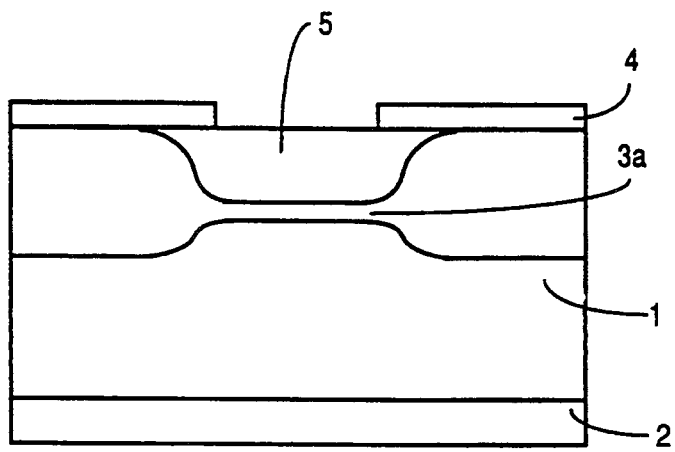

In FIG. 4, a first portion of the arsenic-doped N+ source region 5 is implanted and diffused at a dosage of 3E13 to 1E15/cm$^2$ and energy level of 60 to 80 KeV, to a final surface doping level of 1E18 to 5E19/cm$^3$ and a depth of 0.5 $\mu$m to 1.0 $\mu$m through the substrate principal surface, as defined by the mask 4. This N+ source region diffusion 5 into P body region 3 results in the depth reduction of about 0.5 to 1.5 $\mu$m of a portion of the P body region 3a between the N+ source 5 and the N− epitaxial layer 1. This is known as the boron diffusion retardation effect. (Boron diffusion is slower when arsenic is present.) The purpose of the implanted N+ source region 5 is twofold. First the N+ implantation compensates for the doping concentration of the P body 3a near the channel region. Second, a self-aligned "short" channel is also formed in the process, and threshold voltage determined by P− peak concentration is feasibly adjusted. This "short" channel is the result of a combination of the N+ source 5 doping compensation and boron diffusion retardation effect due to the presence of arsenic from the source diffusion 5 implant.

Figure 5:
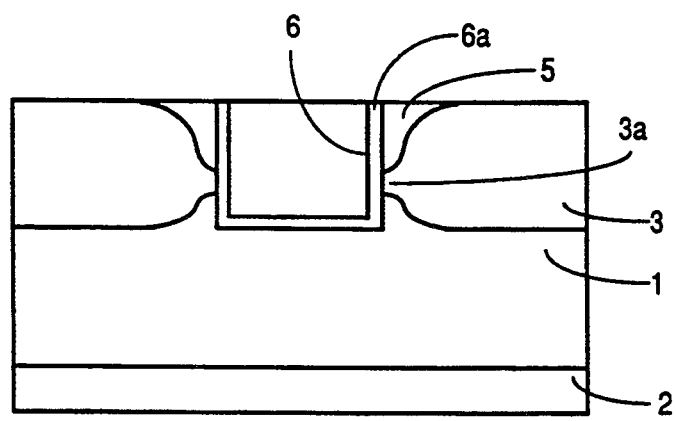

FIG. 5 shows the formation of the U-shaped (rectangular) trench 6 to a depth of 1.0 to 6.0 $\mu$m and width of 1.0 to 3.0 $\mu$m through the N+ source layer 5, the shallow portion of the P body region 3a, and into Nregion 1. Trench 6 formation is accomplished typically by a conventional isotropic etching process through the principal surface using the mask 4 which is then stripped off. Trench 6 is then conventionally lined with gate oxide layer 6a having a thickness of 500 to 1000 Å, after removal of mask 4.

Figure 6:
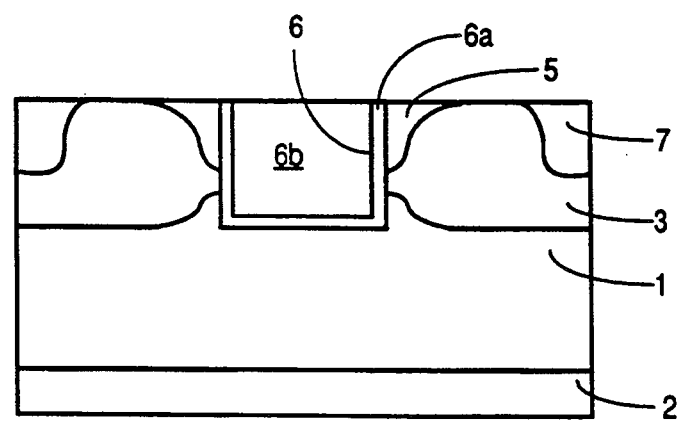

Then in FIG. 6, trench 6 is conventionally filled with doped (conductive) polycrystalline silicon 6b doped to a resistance of 20 to 25 n per square. A boron P+ deep body region 7 is then implanted and diffused using a P+ region mask through the principal surface into the P body region 3 at a dosage of 1E15 to 1E16/cm$^2$ and an energy level of 20 to 40 KeV, to form a final junction depth of 0.5 to 1.0 $\mu$m and a final surface doping level of 1E19 to 1E20/cm$^3$. Pt region 7 is disposed within the P body region 3, spaced from the trench 6 and the first portion of the N+ region 5 but still fairly close by, being spaced 1.0 $\mu$m from trench 6 and 0.5 $\mu$m from N+ region 5.

Figure 7:
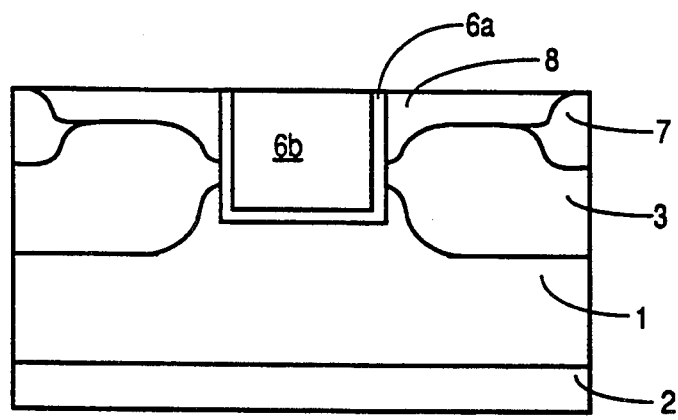

FIG. 7 shows a shallow arsenic implantation and diffusion using the source extension region mask of a source extension region 8 of the N+ source region 5 through the principal surface, in a direction away from the trench over the P body 3, and laterally into the P+ deep body region 7. Region 8 is formed to a depth of 0.3 to 0.5 $\mu$m at a dose of 5E15 to 8E15/cm$^2$ and energy level of 60 to 80 KeV, and to a width of 1.0 to 2.0 $\mu$m. In another embodiment, the source extension region 8 is formed prior to etching of the trench.

Figure 8:
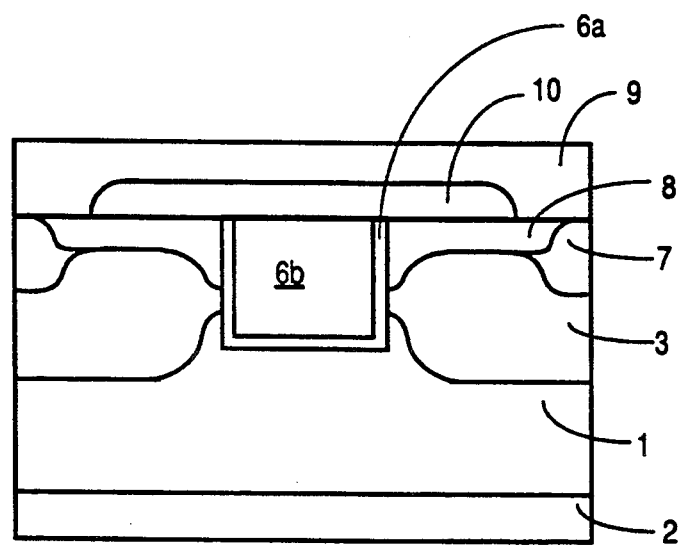

Finally, FIG. 8 shows conventional formation of the oxide insulating layer 10 and metal interconnection layer 9 over the principal surface to complete the trenched DMOS transistor.

In this embodiment, the boron diffusion retardation effect is more pronounced due to a heavier (greater than 10 times heavier) dose of implanted arsenic for region 8 vs. region 5, for the "short" channel formation. Using this effect, a very desirably "short" channel with improved resistance characteristics is fabricated. In addition, ruggedness of this device is good, because the P body region 3 is closer tO the channel, resulting in lower parasitic resistance in P body region 3.

The top side geometry of the trench is any shape such as square, linear, circular, or hexagonal.

Figure 9:
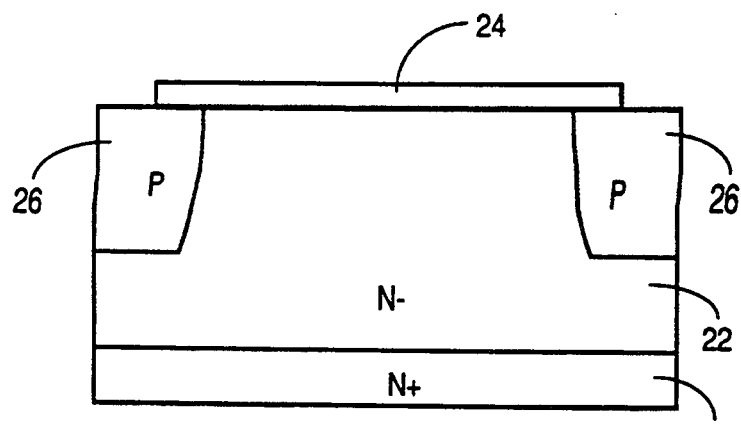
FIGS. 9 to 12 show process steps for a second embodiment with a arsenic source region extension implantation into the source region of the DMOS transistor.

An alternative set of process steps for a second embodiment is shown in FIGS. 9 to 12. In FIG. 9 an N+ substrate 20 on which N− epitaxial layer 22 has been grown is masked by oxide mask layer 24 and a P tub 26 of boron implanted and diffused to a depth of 1 to 3 $\mu$m and final surface doping level of 3E15 to 1E18/cm$^2$ using a dose of 1E13 to 1E14/cm$^2$ at 40 to 60 KeV.

Figure 10:
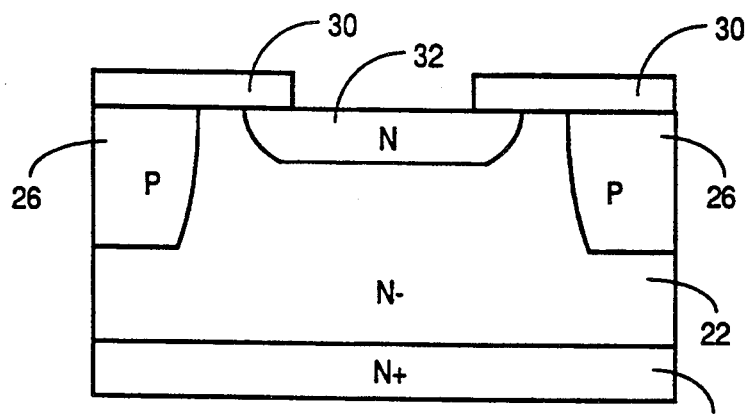

Then in FIG. 10 after diffusion of P tub 26, trench oxide mask layer 30 is conventionally formed and either an arsenic or phosphorous N source region 32 implanted and diffused to a depth of 0.5 to 1.5 $\mu$m and final surface doping level of 1E18 to 5E18 at a dose of 3E13 to 2E14 at 60 to 80 KeV.

Figure 11:
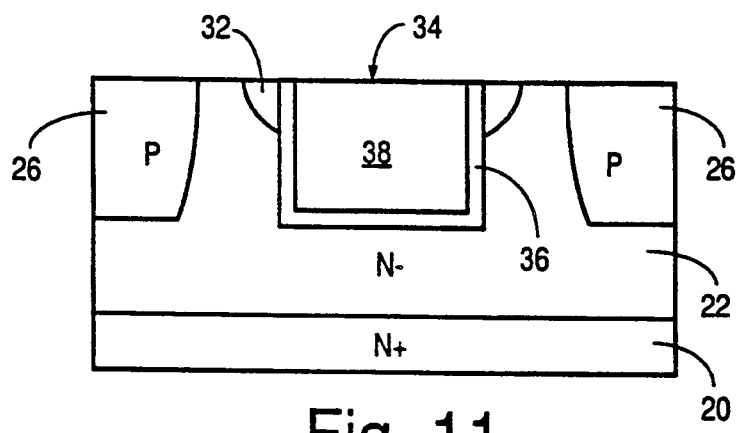

Then in FIG. 11 the trench 34 is isotopically etched through mask layer 30. Then trench mask layer 30 is stripped off, and a conventional gate oxide 36 grown on the sidewalls of trench 34. Then trench 34 is conventionally filled with doped polycrystalline silicon 38 serving as a gate electrode.

Figure 12:
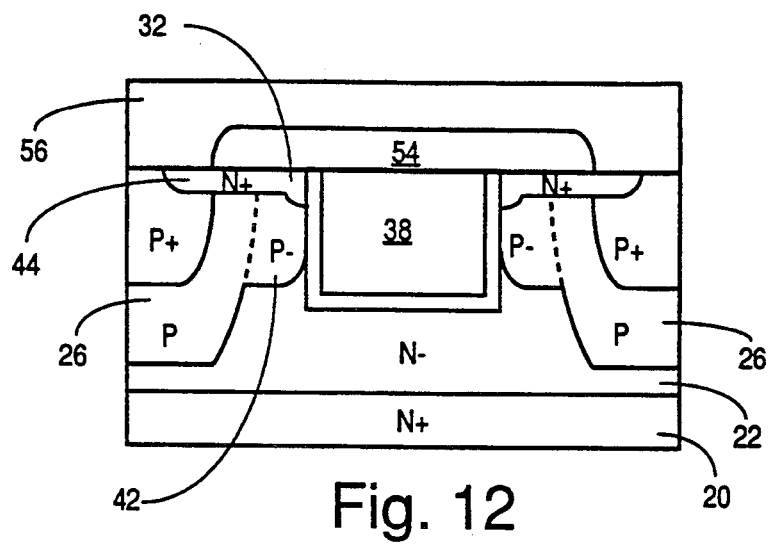

Then in FIG. 12, P-body region 42 is implanted and diffused to a depth of 0.8 to 1.5 $\mu$m and final surface doping level of 5E17 to 2E18/cm$^3$ at 20 to 60 KeV and a dose of 3E13 to 2E14/cm². Then N+ source extension region 44 is arsenic implanted and either diffused or not diffused to a depth of 0.3 to 0.5 μm and a final surface doping level of 4E19 to 6E19/cm³ using a dose of 8E15 to 1E16/cm² at 60 to 80 KeV. Thus in the embodiment of FIG. 12, a "short" channel is formed by a combination of doping compensation with a medium dose of arsenic (N) implantation for the source extension region and boron (P) diffusion retardation effect. In this embodiment, the boron diffusion is slower since arsenic is present.

Figure 13:
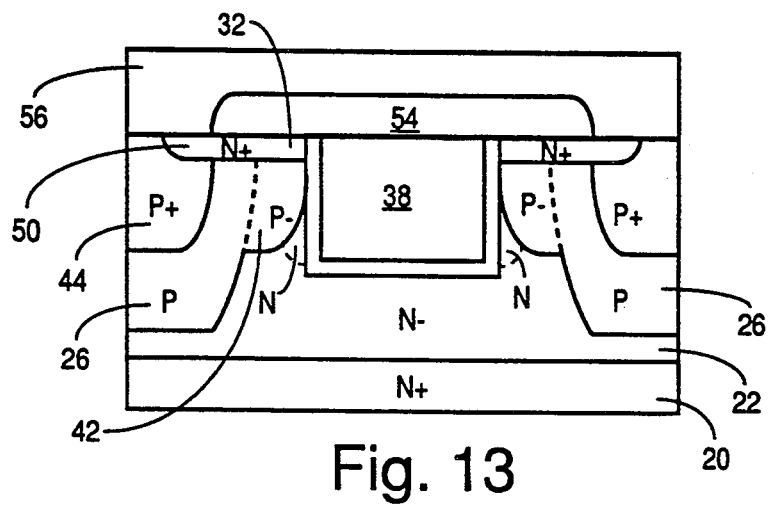
FIG. 13 shows a third embodiment with a phosphorous implant into the/source region of the DMOS transistor.
Figure 14:
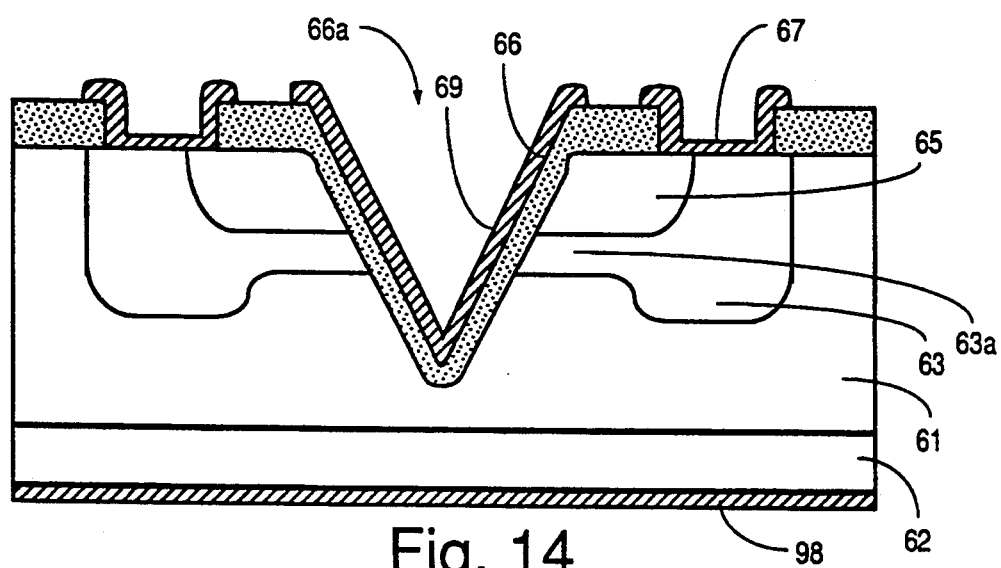
FIG. 14 shows a prior art trenched DMOS transistor.

Alternatively to FIG. 12, in another embodiment in FIG. 13 instead of the N+ source extension 50 being arsenic, it is instead phosphorous implanted and diffused to a depth of 1.0 to 1.5 μm and a final surface doping level of 1E17 to 1E18/cm³ at 60 to 80 KeV and a dose of 1E13 to 1E14/cm². FIG. 13 thus shows the third embodiment of the trenched DMOS transistor, using a phosphorus (N) source extension region implantation in the trench area (instead of arsenic), wherein an even "shorter" channel is formed because phosphorus diffuses faster than arsenic.

Thus for the processes of FIGS. 9 to 12 and 13, in one embodiment seven masks are used: P tub, trench, P+ diffusion, N+ diffusion, contact openings, metal, and bonding pad openings (the latter three steps being conventional and not illustrated).

Both the transistors of FIGS. 12 and 13 are conventionally completed with an oxide insulating layer 54 and metallization layer 56. The peak dopant concentration of the P body regions in the structures of FIGS. 8, 12, and 1S is the same to maintain the same threshold voltage.

Although the invention has been described in terms of specific embodiments for illustrative purposes, it will be appreciated by one skilled in the art that numerous modifications are possible without departing from the scope and spirit of the invention as defined in the claims.

We claim:

1. A trenched transistor comprising:
   a substrate of a first conductivity type defining a trench containing a conductive gate electrode;
   a body region of a second conductivity type extending from a principal surface of the substrate adjacent to the trench into the substrate to a depth less than that of the trench, wherein a portion of the body region immediately adjacent to the trench is shallower with respect to the principal surface than is another portion of the body region away from the trench, an edge of the body region immediately adjacent the trench sloping such that a portion of the edge immediately adjacent the trench is closer to the principal surface; and
   a source region of the first conductivity type formed in the substrate.

2. The transistor of claim 1, wherein the source region extends from the principal surface adjacent to the trench into the substrate to a depth less than that of the body region, the source region being deeper immediately adjacent to the trench and shallower away from the trench with respect to the principal surface.

3. The transistor of claim 1, wherein the source region is deeper immediately adjacent to said trench and shallower away from said trench, with respect to the principal surface.

4. The transistor of claim 1, wherein the body region is shallower with respect to the principal surface immediately adjacent to the trench and deeper away from said trench.

5. The transistor of claim 1, further comprising a deep body region of the second conductivity type extending from the principal surface of the substrate and being of a higher doping concentration than the body region, the deep body region being disposed away from the trench and formed substantially within the body region.

6. A trenched transistor comprising:
   a substrate of a first conductivity type defining a trench containing a conductive gate electrode;
   a body region of a second conductivity type extending from a principal surface of the substrate adjacent to the trench into the substrate to a depth less than that of the trench, wherein a portion of the body region immediately adjacent to the trench has an edged which is sloping such that a portion of the edge immediately adjacent the trench is shallower with respect to the principal surface than is another edge portion of the body region away from the trench; and
   a source region of the first conductivity type formed in the substrate, the source region extending from the principal surface adjacent to the trench into the substrate to a depth less than that of the body region, the source region being deeper immediately adjacent to the trench and shallower away from the trench with respect to the principal surface.

7. The transistor of claim 1, wherein prior to forming the trench, a portion of the source region is implanted and diffused into the body region through the principal surface laterally defined by a mask so as to cause a depth reduction of a portion of the body region between the portion of the source region and the substrate, the portion of the body region with the depth reduction determining a short channel.

8. The transistor of claim 7, wherein said mask is used to etch the trench.

9. The transistor of claim 7, wherein said trench is deeper than the body region with respect to the principal surface.

10. The transistor of claim 7, wherein said portion of the source region is shallowly extended laterally along the principal surface on either side of the trench to form the source region.

11. The transistor of claim 10, wherein a heavy dose of dopant is implanted and diffused to form said shallow extension of the portion of the source region.

* * * * *

UNITED STATES PATENT AND TRADEMARK OFFICE
CERTIFICATE OF CORRECTION

PATENT NO.   :   5,341,011
DATED        :   August 23, 1993
INVENTOR(S)  :   Fwu-Iuan Hshieh, et al.

It is certified that error appears in the above-identified patent and that said Letters Patent is hereby corrected as shown below:

Column 4, line 43
    delete "t0" and insert --to--.

Column 5, line 32
    delete "1S" and insert --13--.

Column 6, line 26
    delete "edged" and insert --edge--.

Signed and Sealed this

Twenty-eight Day of February, 1995

Attest:

BRUCE LEHMAN

*Attesting Officer*          *Commissioner of Patents and Trademarks*